(12) United States Patent
Rasheed et al.

(10) Patent No.: US 9,177,763 B2
(45) Date of Patent: Nov. 3, 2015

(54) METHOD AND APPARATUS FOR MEASURING PRESSURE IN A PHYSICAL VAPOR DEPOSITION CHAMBER

(71) Applicant: APPLIED MATERIALS, INC., Santa Clara, CA (US)

(72) Inventors: Muhammad Rasheed, San Jose, CA (US); Alan A. Ritchie, Menlo Park, CA (US); Isaac Porras, San Francisco, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 360 days.

(21) Appl. No.: 13/837,064

(22) Filed: Mar. 15, 2013

(65) Prior Publication Data

US 2014/0260544 A1    Sep. 18, 2014

(51) Int. Cl.
*H01J 37/244*    (2006.01)
*H01J 37/32*     (2006.01)
*H01J 37/34*     (2006.01)

(52) U.S. Cl.
CPC ....... *H01J 37/32816* (2013.01); *H01J 37/3244* (2013.01); *H01J 37/32935* (2013.01); *H01J 37/3441* (2013.01); *H01J 37/3405* (2013.01)

(58) Field of Classification Search
CPC ............ H01J 37/3244; H01J 37/32816; H01J 37/32935; H01J 37/3441
USPC ............ 73/31.04; 118/712, 715; 156/345.24, 156/345.26; 427/8; 438/14
See application file for complete search history.

(56) References Cited

U.S. PATENT DOCUMENTS

| | | | |
|---|---|---|---|
| 6,296,747 B1 * | 10/2001 | Tanaka | 204/298.07 |
| 2003/0196890 A1 * | 10/2003 | Le et al. | 204/192.12 |
| 2004/0084410 A1 * | 5/2004 | Lenz | 216/67 |
| 2005/0193953 A1 * | 9/2005 | Makino et al. | 118/733 |

OTHER PUBLICATIONS

U.S. Appl. No. 13/836,996, filed Mar. 15, 2013, Rasheed et al.

* cited by examiner

*Primary Examiner* — Peter Macchiarolo
*Assistant Examiner* — Nathaniel Kolb
(74) *Attorney, Agent, or Firm* — Moser Taboada; Alan Taboada (57) ABSTRACT

A method and apparatus for physical vapor deposition are provided herein. In some embodiments, an apparatus for measuring pressure of a substrate processing chamber may include a shield having an annular one-piece body having an inner volume, a top opening and a bottom opening, wherein a bottom of the annular one-piece body includes an inner upwardly extending u-shaped portion, a gas injection adapter disposed about an outer wall of the shield, a pressure measuring conduit formed within the gas injection adapter, wherein the pressure measuring conduit is fluidly coupled the inner volume via a gap formed between an outer wall of the shield and substrate processing chamber components disposed proximate the shield, and wherein the gap has substantially the same pressure as the inner volume, and a pressure detector coupled to the pressure measuring conduit.

20 Claims, 6 Drawing Sheets

METHOD AND APPARATUS FOR MEASURING PRESSURE IN A PHYSICAL VAPOR DEPOSITION CHAMBER

FIELD

Embodiments of the present invention generally relate to physical vapor deposition processing equipment.

BACKGROUND

In a physical vapor deposition (PVD) chamber, uniform distribution of process gases within a closed process chamber is desired during the deposition process. Certain reactive processes such as TiN or TaN benefit when gas is directly injected into the process chamber to ensure uniform film properties such as resistance (Rs) and thickness uniformity. However, a typical PVD chamber indirectly introduces gas into the process chamber through multiple shields (e.g. upper and lower shield).

In addition, traditional PVD chambers measure the pressure outside the process cavity between the shield and chamber body. However, due to gas flow dynamics, this pressure is not representative of actual pressure inside the process cavity. Dynamics further change when gases are delivered into the process chamber. Thus, difficulty arises in determining the actual process pressure a wafer and target is subjected to.

Accordingly, the inventors have provided a system and apparatus for uniform gas injection and improved pressure measurement.

SUMMARY

A method and apparatus for physical vapor deposition are provided herein. In some embodiments, an apparatus for measuring pressure of a substrate processing chamber may include a shield having an annular one-piece body having an inner volume, a top opening and a bottom opening, wherein a bottom of the annular one-piece body includes an inner upwardly extending u-shaped portion, a gas injection adapter disposed about an outer wall of the shield, a pressure measuring conduit formed within the gas injection adapter, wherein the pressure measuring conduit is fluidly coupled the inner volume via a gap formed between an outer wall of the shield and substrate processing chamber components disposed proximate the shield, and wherein the gap has substantially the same pressure as the inner volume, and a pressure detector coupled to the pressure measuring conduit.

In some embodiments, a method for measuring pressure of a substrate processing chamber may include measuring a pressure of a pressure measuring conduit formed within a gas injection adapter disposed about an outer wall of a shield having an annular one-piece body and an inner volume, wherein the pressure measuring conduit is fluidly coupled the inner volume via a gap formed between the shield and a target, and wherein the gap has substantially the same pressure as the inner volume, and determining the pressure of the inner volume based on the measured pressure of the pressure measuring conduit.

In some embodiments, a gas injection shield assembly for measuring pressure of a substrate processing chamber may include a gas source, a shield having an annular one-piece body having an inner volume, a top opening and a bottom opening, wherein a bottom of the annular one-piece body includes an inner upwardly extending u-shaped portion, a target and a substrate placed in the inner volume, a gas injection adapter externally surrounding the shield, the gas injection adapter further comprising: a gas injection line coupled to the gas source; a gas inlet line; and a pressure detector coupled to a pressure measuring conduit formed within the gas injection adapter, wherein the pressure measuring conduit is coupled to a gap formed between the shield and the target, and wherein the gap has substantially the same pressure as the inner volume.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

A system and apparatus for improved physical vapor deposition (PVD) processing equipment are provided herein. In at least some embodiments of the present invention, the system and apparatus provide a gas injection adapter to provide uniform gas injection and/or internal chamber pressure measurements. In at least some embodiments, such PVD processes may advantageously be high density plasma assisted PVD processes, such as described below. A one-piece shield design allows for a reduced part count and improved structural integrity of the chamber.

Figure 1:
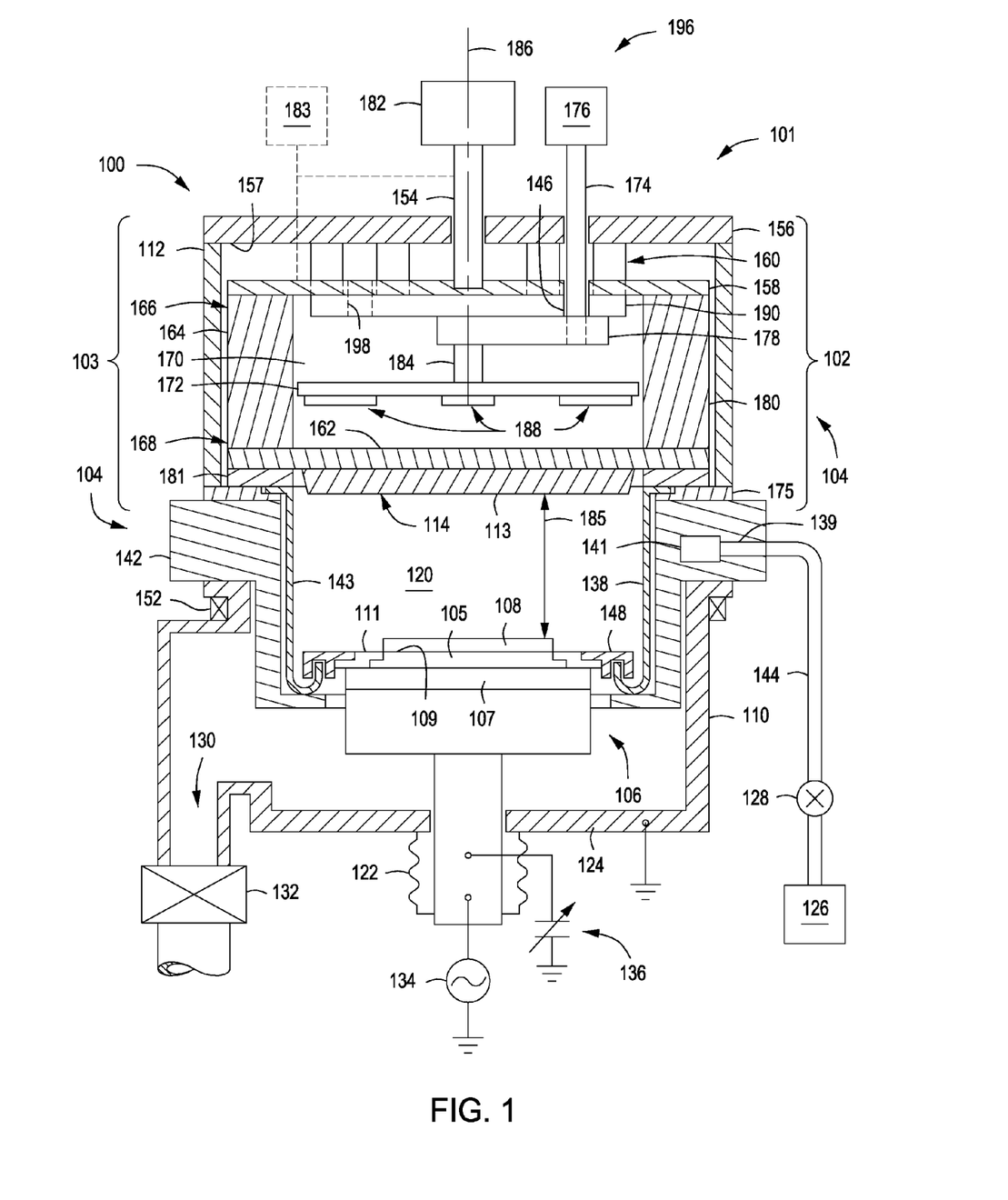
FIG. 1 depicts a cross-sectional view of a physical vapor deposition chamber in accordance with some embodiments of the present invention.

FIG. 1 depicts a simplified, cross-sectional view of an illustrative PVD chamber 100 having a magnetron assembly in accordance with some embodiments of the present invention. The specific configuration of the PVD chamber is illustrative and PVD chambers having other configurations may also benefit from modification in accordance with the teachings provided herein. Examples of suitable PVD chambers include any of the ENDURA® line of PVD processing chambers, commercially available from Applied Materials, Inc., of Santa Clara, Calif. Other processing chambers from Applied Materials, Inc. or other manufactures may also benefit from the inventive apparatus disclosed herein.

In some embodiments of the present invention, the PVD chamber 100 includes a chamber lid 101 disposed atop a chamber body 104 and removable from the chamber body 104. The chamber lid 101 generally includes a target assembly 102 and a grounding assembly 103. The chamber body 104 contains a substrate support 106 for receiving a substrate 108 thereon. The substrate support 106 is configured to support a substrate such that a center of the substrate is aligned with a central axis 186 of the PVD chamber 100. The substrate support 106 may be located within a grounded enclosure wall 110, which may be a wall of the chamber body 104. The grounded enclosure wall 110 may be electrically coupled to the grounding assembly 103 of the chamber lid 101 such that an RF return path is provided to a radio frequency (RF) power source 182 disposed above the chamber lid 101. Alternatively, other RF return paths are possible, such as those that travel from the substrate support 106 via a process kit shield (e.g., a single piece shield 138 as discussed below) and ultimately back to the grounding assembly 103 of the chamber lid 101. The RF power source 182 may provide RF energy to the target assembly 102 as discussed below.

The substrate support 106 has a material-receiving surface facing a principal surface of a target 114 and supports the substrate 108 to be sputter coated with material ejected from the target 114 in planar position opposite to the principal surface of the target 114. The substrate support 106 may include a dielectric member 105 having a substrate processing surface 109 for supporting the substrate 108 thereon. In some embodiments, the substrate support 106 may include one or more conductive members 107 disposed below the dielectric member 105. For example, the dielectric member 105 and the one or more conductive members 107 may be part of an electrostatic chuck, RF electrode, or the like which may be used to provide chucking or RF power to the substrate support 106.

The substrate support 106 may support the substrate 108 in an inner volume 120 of the chamber body 104. The inner volume 120 is a portion of the chamber body 104 that is used for processing the substrate 108 and may be separated from the remainder of the body volume (e.g., a non-processing volume) during processing of the substrate 108 (for example, via the shield 138). The inner volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through an opening (such as a slit valve, not shown) in the lower portion of the chamber body 104 and thereafter raised to a processing position. A bellows 122 connected to a bottom chamber wall 124 may be provided to maintain a separation from the atmosphere outside of the chamber body 104. One or more gases may be supplied from a gas source 126 through a mass flow controller 128 into a gas injection adapter 142 via a gas injection line 144. The gas injection line 144 is coupled to a gas inlet line 139 within the gas injection adapter 142. The gas inlet line 139 is connected to welded ring cap 141 and is also located within the gas injection adapter 142. As will be discussed further below in FIGS. 2 and 3, the gas inlet line 139 is coupled to one or more channel gas channels to supply process gas directly into the inner volume 120. An exhaust port 130 may be provided and coupled to a pump (not shown) via a valve 132 for exhausting the interior of the chamber body 104 and to facilitate maintaining a desired pressure inside the chamber body 104.

An RF bias power source 134 may be coupled to the substrate support 106 in order to induce a negative DC bias on the substrate 108. In addition, in some embodiments, a negative DC self-bias may form on the substrate 108 during processing. In some embodiments, RF energy supplied by the RF bias power source 134 may range in frequency from about 2 MHz to about 60 MHz. In other applications, the substrate support 106 may be grounded or left electrically floating. Alternatively or in combination, a capacitance tuner 136 may be coupled to the substrate support 106 for adjusting voltage on the substrate 108 for applications where RF bias power is not be desired.

The chamber body 104 further includes a process kit shield (shield 138) to surround the processing, or inner volume 120, of the chamber body 104 and to protect other chamber components from damage and/or contamination from processing. In other embodiments, and as illustrated in FIG. 1, the shield 138 may be coupled to the chamber lid 101, for example via a support member 175.

The shield 138 comprises an inner wall 143 disposed between the target 114 and the substrate support 106. The shield 138 is surrounded by the gas injection adapter 142. The shield 138 is coupled to the gas injection adapter 142 such that the gas injection adapter 142 that may introduce process gas into the inner volume 120 via a series of vents 116 (e.g. holes) in the shield 138. The height of the shield 138 depends upon the distance 185 between the target 114 and the substrate 108. The distance 185 between the target 114 and the substrate 108, and correspondingly, the height of the shield 138, is scaled based on the diameter of the substrate 108. In some embodiments, the dimensions of the shield 138 and target 114 are set such that the ratio of the shield area to the target area may be greater than 1. In some embodiments, a distance 185 between the target 114 and the substrate 108 may be selected to correspond with the thickness of the substrate 108 such that the distance 185 is appropriately increased to correspond with a thicker substrate 108 and appropriately decreased to correspond with a thinner substrate 108. In some embodiments, in some embodiments, the distance 185 may be from about 50.8 mm to about 152.4 mm for a 300 mm substrate 108, or about 101.6 mm to about 203.2 mm for a 450 mm substrate. A process chamber having the above configurations is referred to herein as a "short throw" process chamber.

The short throw process chamber advantageously increases the deposition rate over process chambers having longer target to substrate distances (e.g., distance 185). For example, for some processes, conventional process chambers having longer target to substrate distances provide a deposition rate of about 1 to about 2 angstroms/second. In comparison, for similar processes in a short throw process chamber, a deposition rate of about 5 to about 10 angstroms/second can be obtained while maintaining high ionization levels. In some embodiments, a process chamber in accordance with embodiments of the present invention may provide a deposition rate of about 10 angstroms/second. High ionization levels at such short spacing can be obtained by providing a high pressure, and a very high driving frequency, for example, from about 27 MHz to about 162 MHz.

The chamber lid 101 rests on the gas injection adapter 142 of the grounded enclosure wall 110. The grounded enclosure wall 110 may provide a portion of the RF return path for the grounding assembly 103 of the chamber lid 101. However, other RF return paths are possible, such as via the shield 138.

As discussed above, the shield 138 extends downwardly and may include one or more sidewalls configured to surround the inner volume 120. The shield 138 extends along, but is spaced apart from, the grounded enclosure wall 110 downwardly to below a top surface of the substrate support 106 and returns upwardly until reaching a top surface of the substrate support 106 (e.g., forming a u-shaped portion at the bottom of the shield 138).

A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition.

A dielectric ring 111 (e.g. deposition ring) may be used to shield the periphery of the substrate 108 from deposition. For example, the dielectric ring 111 may be disposed about a peripheral edge of the substrate support 106 and adjacent to the substrate processing surface 109.

The first ring 148 may include protrusions extending from a lower surface of the first ring 148 on either side of the inner upwardly extending u-shaped portion of the bottom of the shield 138. An innermost protrusion may be configured to interface with the substrate support 106 to align the first ring 148 with respect to the shield 138 when the first ring 148 is moved into the second position as the substrate support 106 is moved into the processing position. For example, a substrate support facing surface of the innermost protrusion may be tapered, notched or the like to rest in/on a corresponding surface on the substrate support 106 when the first ring 148 is in the second position.

In some embodiments, a magnet 152 may be disposed about the chamber body 104 for selectively providing a magnetic field between the substrate support 106 and the target 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the grounded enclosure wall 110. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extend from the first surface 157 of the grounding plate 156 and surround the target assembly 102. The grounding assembly 103 may include a support member 175 to support the target assembly 102 within the grounding assembly 103.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield (e.g., that may be disposed between the shield 138 and the target assembly 102, not shown). The seal ring 181 may be a ring or other annular shape having a desired cross-section to facilitate interfacing with the target assembly 102 and with the support member 175. The seal ring 181 may be made of a dielectric material, such as ceramic. The seal ring 181 may insulate the target assembly 102 from the ground assembly 103.

The support member 175 may be a generally planar member having a central opening to accommodate the shield 138 and the target 114. In some embodiments, the support member 175 may be circular, or disc-like in shape, although the shape may vary depending upon the corresponding shape of the chamber lid and/or the shape of the substrate to be processed in the PVD chamber 100. In use, when the chamber lid 101 is opened or closed, the support member 175 maintains the shield 138 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, magnetic material, or the like. In some embodiments, the target 114 may include a backing plate 162 to support the source material 113. The backing plate 162 may comprise a conductive material, such as copper-zinc, copper-chrome, or the same material as the target, such that RF, and optionally DC, power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical and tubular, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid, such as water ($H_2O$) or the like. In some embodiments, a divider (not shown) may be provided to contain the cooling fluid in a desired portion of the cavity 170 (such as a lower portion, as shown) and to prevent the cooling fluid from reaching components disposed on the other side of the divider.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between about 5 to about 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF power source 182 to the target 114 in an axisymmetric manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. The electrode 154 may be fabricated from any suitable conductive material, such as aluminum, copper, silver, or the like.

The electrode 154 may pass through an opening in the grounding plate 156 and is coupled to a source distribution plate 158. The grounding plate 156 may comprise any suitable conductive material, such as aluminum, copper, or the like. Open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the PVD chamber 100. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

The magnetron assembly 196 is rotated within the cavity 170. For example, in some embodiments, the motor 176, motor shaft 174, gear box 178, and gearbox shaft 184 may be provided to rotate the magnet support member 172. In some embodiments (not shown), the magnetron drive shaft may be disposed along the central axis of the chamber, with the RF energy coupled to the target assembly at a different location or in a different manner. As illustrated in FIG. 1, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188). The gear box shaft 184 may advantageously be coincident with the central axis 186 of the PVD chamber 100.

The magnet support member 172 may be constructed from any material suitable to provide adequate mechanical strength to rigidly support the plurality of magnets 188. The plurality of magnets 188 may be configured in any manner to provide a magnetic field having a desired shape and strength to provide a more uniform full face erosion of the target as described herein.

Alternatively, the magnet support member 172 may be rotated by any other means with sufficient torque to overcome the drag caused on the magnet support member 172 and attached plurality of magnets 188, for example due to the cooling fluid, when present, in the cavity 170.

Figure 2:
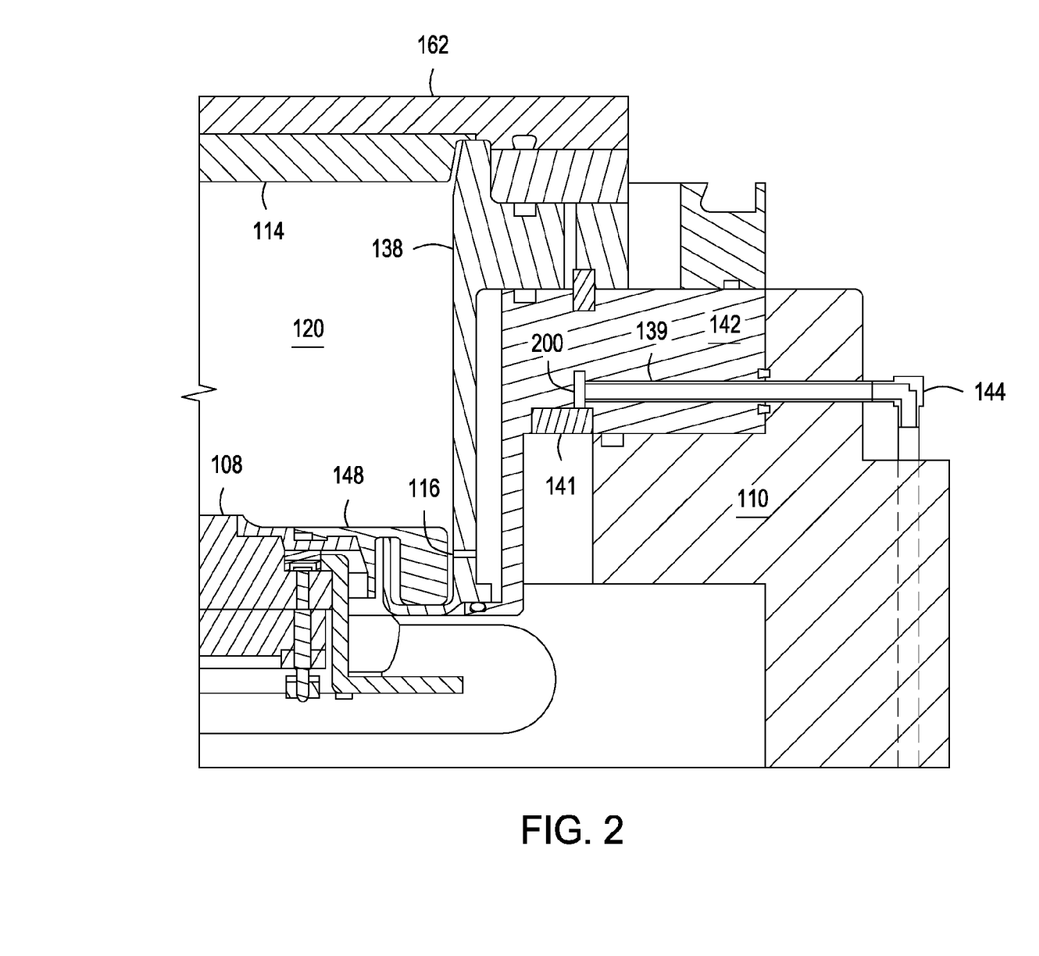
FIG. 2 depicts a sectional view of a gas injection line and surrounding structure in accordance with some embodiments of the present invention.

FIG. 2 depicts a sectional view of a gas injection line 144 and surrounding structure in accordance with some embodiments of the present invention. In some embodiments, the gas injection line 144 may pass through the enclosure wall 110. The gas injection line 144 is fluidly coupled to the gas inlet line 139 within the gas injection adapter 142. Injected gas flows through a series of gas channels beginning with a first gas channel 200 that is coupled to the gas inlet line 139 within the gas injection adapter 142. The first gas channel 200 substantially encompasses the shield 138 and is ultimately fluidly coupled to the vents 116 formed in the shield 138. The vents 116 allow gas to be uniformly distributed into the inner volume 120. The vents 116 are located towards the bottom portion of the shield 138 such that the gases are introduced away from the target 114 to prevent poisoning/reaction with the target 114 or reaction with the substrate 108.

Figure 3:
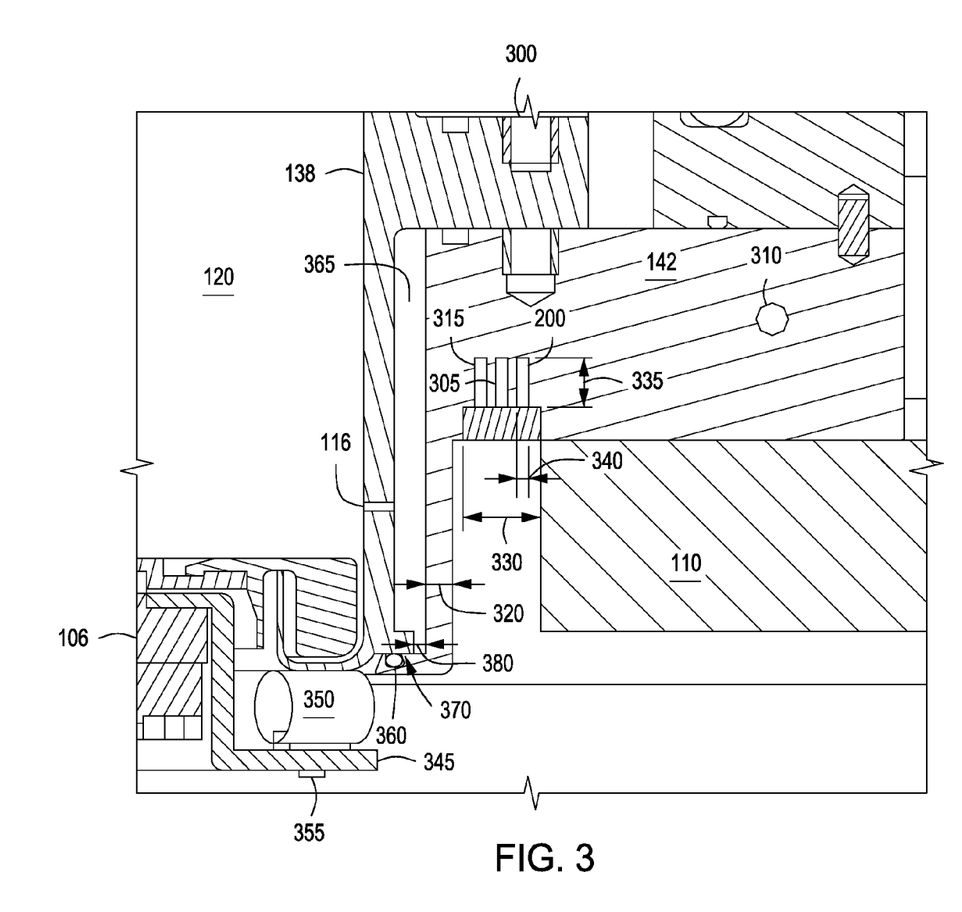
FIG. 3 depicts a detailed sectional view of a gas injection adapter and plenums coupled to the gas inlet line of FIG. 2 in accordance with some embodiments of the present invention.

FIG. 3 depicts a detailed sectional view of a gas injection adapter and gas channels coupled to the gas inlet line of FIG. 2 in accordance with some embodiments of the present invention. The shield 138 is secured in position to the gas injection adapter 142 via locating pin 300. FIG. 2 also depicts some embodiments of the gas injection adapter 142 may include a gun drill water line 310 for cooling the shield 138 by flowing a coolant through gun drill water line 310. FIG. 3 further depicts the first gas channel 200 branches to a second set of second gas channels 305 that are equidistant. The second set of second gas channels 305 may be also connected to yet a third set of third gas channels 315 before reaching vents 116 that are placed equidistant from one another in the shield 138. The number of sets gas channels is selected to maintain uniform distances of gas entry points and may vary according to the size of the inner volume 120. In some embodiments, the gas injection adapter 142 surrounding the shield 138 has a uniform thickness 320. In some embodiments, the width 340 of each gas channel is approximately less than a height 335. All gas channels (e.g., first gas channel 200, second gas channel 305, and third gas channel 315) may comprise a total width 325 and coupled to the welded ring cap 141 with a width 330.

FIG. 3 further depicts the gas injection adapter 142 surrounds the shield 138 and separated by a gap 380. The gap 380 separation is part of a second volume (e.g. gas pocket) 365 and may be about 1.0 mm to about 16.0 mm wide. The shield 138 is coupled to the gas injection adapter 142 just below the vents 116 via a flexible member 360 (e.g., compliable gasket, O-ring, or the like). The flexible member 360 fits into a slot 370 that may be a half dove tail groove to ensure gas does not leak out from the gas injection adapter 142. The flexible member 360 also accommodates for tolerance stacking of the components or unequal thermal expansion between the shield 138 and gas injection adapter 142. In some embodiments, the bottom of the shield 138 is coupled to a hard stop 350 which may act as a grounding loop, and is mounted on support flange 345. In some embodiments, the hard stop 350 is a ring comprising aluminum or stainless steel. The hard stop 350 prevents the dielectric ring 111 from crashing into the first ring 148 and grounds the shield. The hard stop 350 is coupled to a support flange 345 via a vertical securing member 355. The support flange 345 is coupled to substrate support 106. The support flange 345 reinforces the hard stop 350 against vertical forces as the substrate support 106 is moved into the processing position.

Figure 4:
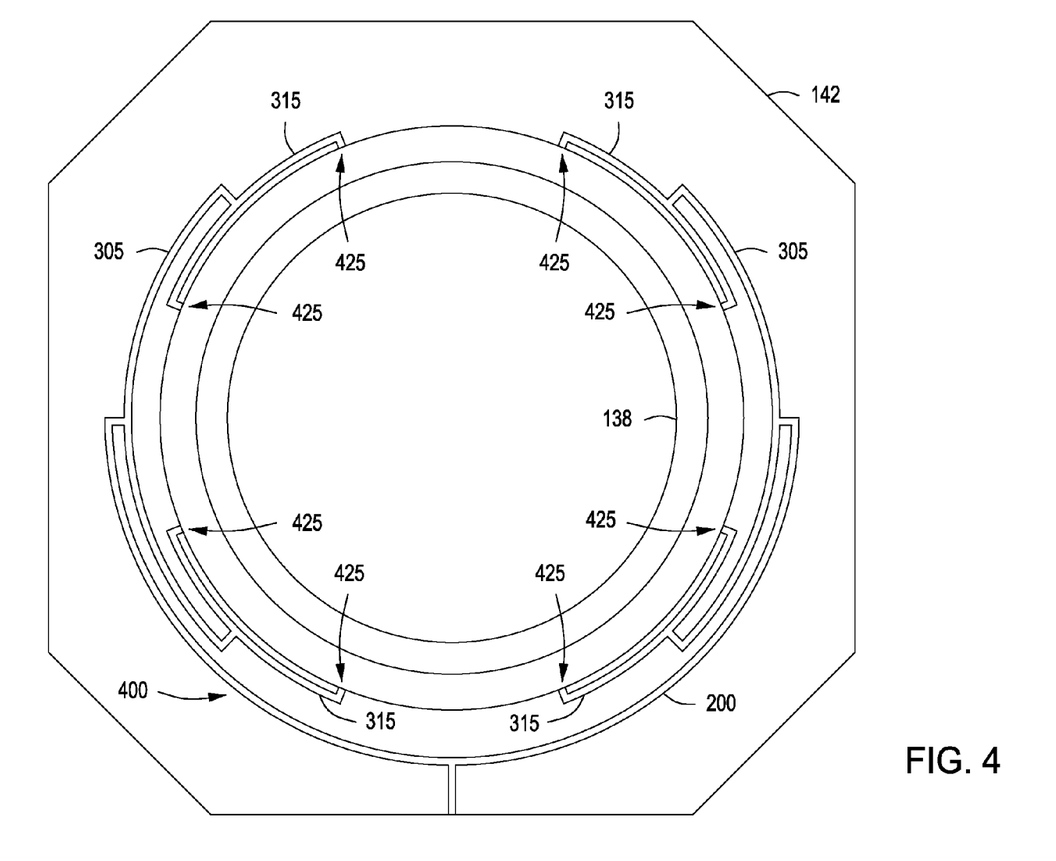
FIG. 4 depicts a partial cross-sectional overhead view of the gas injection adapter and shield in accordance with some embodiments of the present invention.

FIG. 4 depicts a partial cross-sectional overhead view of the gas injection adapter 142 and shield 138 in accordance with some embodiments of the present invention. FIG. 4 further depicts a detailed view of the labyrinth 400 of gas channels. In some embodiments, the labyrinth 400 of gas channels is a plurality of concentric gas channels coupled to each other via a plurality of radial channels. As shown in FIG. 4, for example, in some embodiments, each inner concentric gas channel (e.g., 315) of the plurality of concentric gas channels splits an input from an outer concentric gas channel (e.g., 305) to which it is coupled, into a plurality of outputs. In some embodiments, the innermost concentric gas channel of the plurality of concentric gas channels includes a plurality of ports 425 to uniformly distribute gas into the gap. For example, process gas from the gas inlet line 139 may flow to a gas injection port 415 into the first gas channel 200 from FIG. 3. The first gas channel 200 may be an 180° arc or other shape to substantially surround the inner volume 120 and/or target 114. In some embodiments, the first gas channel 200 is coupled to the second set of second gas channels 305 to form the labyrinth 400 of interconnected gas injection channels in the gas injection adapter 142. Each inlet of the labyrinth 400 may include a recursive pattern split (e.g., in the exemplary embodiment of FIG. 4, the split is 1:2). In some embodiments, the split is located such that each successive inlet is equidistant from a previous inlet. The channels of the labyrinth 400 are evenly spaced and in some embodiments may be comprised of a series of serpentine turns form from concentric gas channels.

In some embodiments, as gas flows through the first gas channel 200 the gas enters into exemplary two sets of second gas channels 305 that distribute the gas an equal distance before entering into exemplary four sets of the third gas channels 315 where gas is symmetrically distributed to gas pocket 365. The channels from the third gas channels 315 in this exemplary embodiment form eight ports 425 (may be for example, up to 16) that are coupled to the shield 138 via the gas pocket 365 for direct injection into the inner volume 120.

The equal distance separation and labyrinth 400 ensure gases are uniformly distributed into the gas pocket 365 via the ports 425. Thus, process gas originating from a single gas inlet line 139 may be symmetrically introduced in the gas pocket 365 and subsequently, the inner volume 120. In some embodiments the labyrinth 400 may comprise various other splits such that labyrinth 400 functions as a channel with a first end coupled to the gas inlet line 139 and a second end is coupled to the gas pocket 365. The second end comprising the ports 425. In some embodiments, the ports 425 are equidistant from respective inlets.

Figure 5:
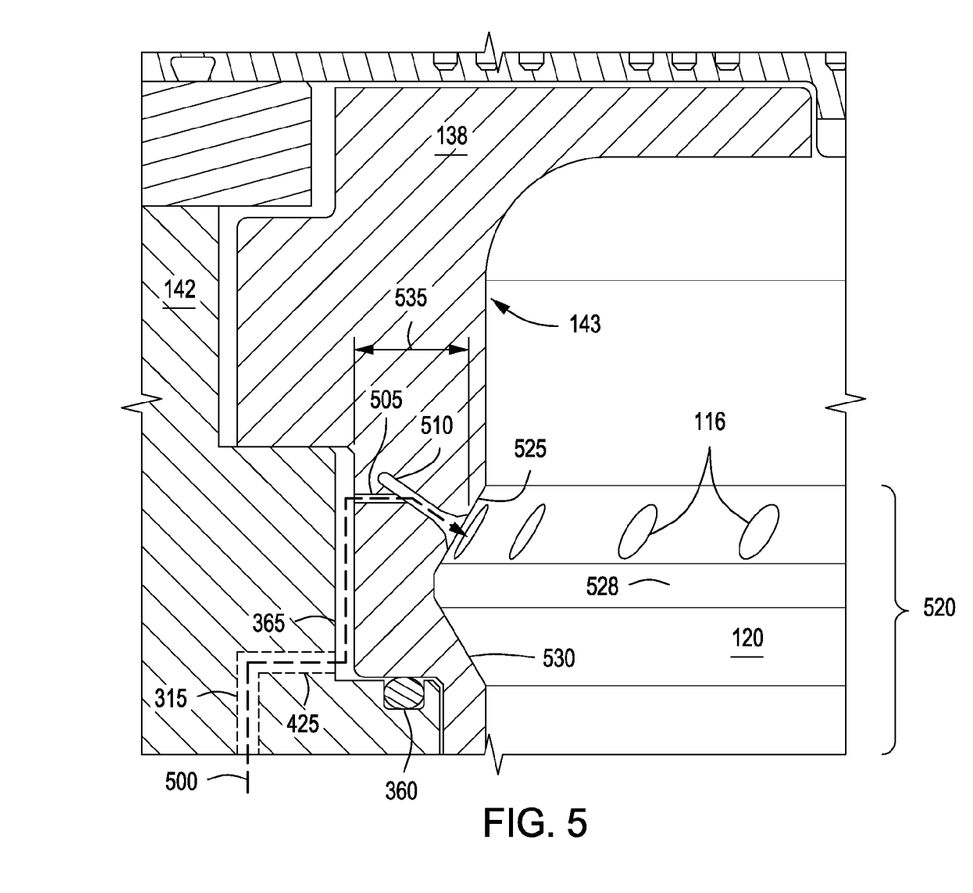
FIG. 5 depicts a partial cross-sectional overhead view of the gas injection adapter and shield vents in accordance with some embodiments of the present invention.

FIG. 5 depicts a partial cross-sectional overhead view of the gas injection adapter and shield in accordance with some embodiments of the present invention. The gas pocket 365 (e.g. gap) occupies an area surrounding and separating the gas injection adapter 142 and the shield 138. In some embodiments, the width of the gas pocket separating the gas injection adapter 142 and the shield 138 is about 3 mm. The gas pocket 365 accordingly fills with process gas symmetrically. In some embodiments, gas holes 505 may be of a smaller diameter than the gas inlet 510. The gas inlets 510 and gas holes 505 are formed through a thickness 535 of the inner wall 143 to couple with the vents 116. As shown by an arrow 500 representing gas flow, the process gas flows from the gas pocket 365 through the gas holes 505 and gas inlets 510 leading to the respective vents of the vents 116 and into the inner volume 120. In some embodiments, the gas inlets 510 are downwardly sloped in a radially inward direction for efficient flow to vents 116 and to prevent clogging. In some embodiments, the gas holes 505 are coupled to an end of the gas inlets 510 and in other embodiments, proximate the end of the gas inlets 510 (as in FIG. 5). In some embodiments, the gas injection port 455 may be disposed in the gas injection adapter 142 to facilitate distribution of the gases about the shield 138.

The inner wall 143 of the shield 138 is substantially cylindrical forming the inner volume 120. In some embodiments, the side walls of the inner wall 143 may include an annular groove 520 formed into the inner wall 143 comprising a first angled edge 525 coupled to a second angled edge 530. The first angled edge 525 is of an upward slope and the second angled edge 530 is of a downward slope and are of mirrored angles such that the two edges form the annular groove 520.

In some embodiments, the annular groove may also comprise a vertical edge 528 between the first angled edge 525 and the second angled edge 530. In some embodiments, the vents 116 are located along a first angled edge 525 to prevent clogging and for gas flow (arrow 500) distribution. In some embodiments, the first angled edge 525 may be angled downward and radially inward as part of the annular groove towards the center of the inner volume 120. In some embodiments, the vents 116 are conic in shape. The gas flow (arrow 500) exits the third gas channel 315 via the port 425 into the gas pocket 365.

The vents 116 may be of similar diameter of the gas inlets 510 but are selected to prevent the process plasma from leaking out to the gas injection adapter 142 and prevent damage from stray plasma. The number of vents 116 may vary and are equally spaced in along a row around the shield 138. In some embodiments, the shield may have up to about 150 vents 116. In some embodiments, the vents 116 may be behind the first ring 148 to further prevent clogging and maintaining a constant conductance path for the gas throughout the life of the PVD chamber 100.

Figure 6:
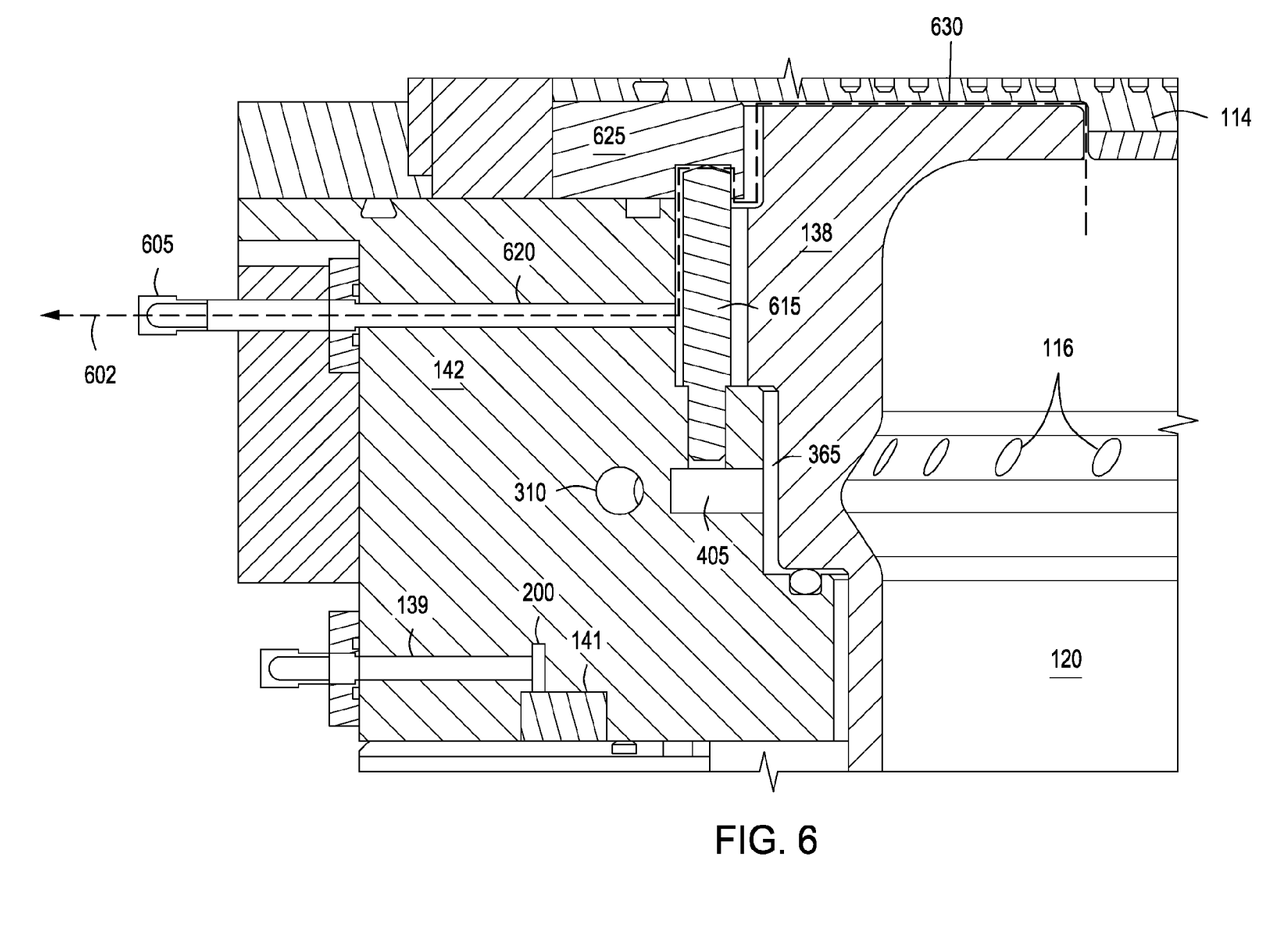
FIG. 6 depicts a detailed sectional view of a pressure detector coupled through the gas injection adapter in accordance with some embodiments of the present invention.

FIG. 6 depicts a detailed sectional view 600 of a pressure detector 605 coupled through the gas injection adapter in accordance with some embodiments of the present invention. The shield 138 coupled to the gas injection adapter 142 via a vertical locating pin 615 and a horizontal nut plate 610. The pressure detector 605 is located external to the gas injection adapter 142. The pressure detector 605 may be any one of a pressure transducer, manometer, or the like. Process gas enters the gas injection adapter 142 via the gas inlet line 139 coupled to the welded ring cap 141. The pressure detector 605 is coupled to an electronic device (e.g. computer) for monitoring the pressure of the inner volume 120. In some embodiments, the pressure transducer converts pressure received into measurable electronic data via an analog to digital (ND) converter for processing by a processor and a memory.

A measurement gas flow 602 is measured from a flow path shown as arrow 602 in the gas injection adapter 142 using the pressure detector 605 located externally of the gas injection adapter 142. The path 602 continues through a measuring conduit 620 formed within the gas injection adapter 142. After the measuring conduit 620, the path 602 continues to be in parallel with the vertical locating pin 615 and flows around a ceramic isolator 625. The path 602 thus avoidingly flows around respective perimeters of the vertical locating pin 615 and ceramic isolator 625 to reach a dark space gap 630.

The ceramic isolator 625 is formed between the target 114, gas injection adapter 142, and the shield 138. The ceramic isolator 625 is coupled to the dark space gap 630 between the shield 138 and target 114. In some embodiments, the dark space gap 630 is small enough to allow for a pressure measurement without compromising the pressure within the inner volume 120. The dark space gap 630 is used to prevent shorting (grounding) or arcing of the energized target 114. As used herein, "dark space" refers to the area/volume where no plasma can be sustained. The dark space gap 630 has a pressure that is substantially the same as a process pressure within the inner volume 120. In some embodiments O-rings or other types of seals may be used to seal the target and adapter such that the inner volume 120 maintains pressure while allowing the dark space gaps 630 to have the same pressure. The static pressure of the dark space gap 630 has a similar pressure of that within the inner volume 120. Thus one may estimate the pressure of the dark space gap 630 by measuring the pressure of the dark space gap 630 using an pressure detector 605 coupled to the gas injection adapter 142.

By measuring the dark space gap 630 pressure, one is capable of determining the pressure of the inner volume 120 without modifying the shield 138. Such a method also allows pressure measurements to be taken without disrupting the deposition process within the inner volume 120.

While the foregoing is directed to embodiments of the present invention, other and further embodiments of the invention may be devised without departing from the basic scope thereof.

The invention claimed is:

1. An apparatus for measuring pressure of a substrate processing chamber comprising:
a shield having an annular one-piece body having an inner volume, a top opening and a bottom opening, wherein a bottom of the annular one-piece body includes an inner upwardly extending u-shaped portion;
a gas injection adapter disposed about an outer wall of the shield;
a pressure measuring conduit formed within the gas injection adapter, wherein the pressure measuring conduit is fluidly coupled to the inner volume via a gap formed between an outer wall of the shield and substrate processing chamber components disposed proximate the shield, and wherein the gap has substantially the same pressure as the inner volume; and
a pressure detector coupled to the pressure measuring conduit.

2. The apparatus of claim 1, wherein the shield includes a plurality of gas distribution vents disposed through the body.

3. The apparatus of claim 1, wherein the shield is coupled to the gas injection adapter via a locator pin.

4. The apparatus of claim 3, wherein the pressure measuring conduit couples to the gap via a gas flow path formed avoidingly around the locator pin.

5. The apparatus of claim 1, wherein at least part of the gap is formed between a target disposed in the substrate processing chamber and the shield.

6. The apparatus of claim 5, wherein at least part of the gap is a dark space gap.

7. The apparatus of claim 1, wherein the pressure detector further comprises a pressure transducer for converting pressure into measurable data by an electronic device.

8. A method for measuring pressure of a substrate processing chamber comprising:
measuring a pressure of a pressure measuring conduit formed within a gas injection adapter disposed about an outer wall of a shield having an annular one-piece body and an inner volume, wherein the pressure measuring conduit is fluidly coupled to the inner volume via a gap formed between the shield and a target, and wherein the gap has substantially the same pressure as the inner volume; and
determining the pressure of the inner volume based on the measured pressure of the pressure measuring conduit.

9. The method of claim 8, wherein the shield includes a plurality of gas distribution vents disposed through the body.

10. The method of claim 8, wherein the shield is coupled to the gas injection adapter via a locator pin.

11. The method of claim 10, wherein pressure measuring conduit is coupled to the gap via a gas flow path located proximate the locator pin and a ceramic isolator.

12. The method of claim 8, wherein the gap is a dark space gap.

13. The method of claim 12, wherein the dark space gap is proximate a locator pin and a ceramic isolator.

14. The method of claim 8, wherein measuring further comprises converting pressure into measurable data via a pressure transducer such that the measurable data is processed by an electronic device.

15. A gas injection shield assembly for measuring pressure of a substrate processing chamber comprising:
a gas source;
a shield having an annular one-piece body having an inner volume, a top opening and a bottom opening, wherein a bottom of the annular one-piece body includes an inner upwardly extending u-shaped portion;
a target and a substrate placed in the inner volume;
a gas injection adapter externally surrounding the shield, the gas injection adapter further comprising:
a gas injection line coupled to the gas source;
a gas inlet line; and
a pressure detector coupled to a pressure measuring conduit formed within the gas injection adapter, wherein the pressure measuring conduit is coupled to a gap formed between the shield and the target, and wherein the gap has substantially the same pressure as the inner volume.

16. The gas injection shield assembly of claim 15, wherein the shield includes a plurality of gas distribution vents disposed through the body.

17. The gas injection shield assembly of claim 15, wherein the shield is coupled to the gas injection adapter via a locator pin.

18. The gas injection shield assembly of claim 17, wherein the pressure measuring conduit couples to the gap via a gas flow path formed avoidingly around the locator pin and a ceramic isolator.

19. The gas injection shield assembly of claim 15, wherein at least part of the gap is a dark space gap.

20. The gas injection shield assembly of claim 15, wherein the pressure detector further comprises a pressure transducer for converting pressure into measurable data by an electronic device.

\* \* \* \* \*